US012575052B2

(12) United States Patent
Mosti et al.

(10) Patent No.: US 12,575,052 B2
(45) Date of Patent: Mar. 10, 2026

(54) TELECOMMUNICATIONS NETWORK EQUIPMENT UNIT COMPRISING A COOLING SYSTEM

(71) Applicant: Telefonaktiebolaget LM Ericsson (publ), Stockholm (SE)

(72) Inventors: Sergio Mosti, Genoa (IT); Claudio D'Incá, Genoa (IT); Marco Assale, Genoa (IT)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 210 days.

(21) Appl. No.: 18/281,150

(22) PCT Filed: Mar. 8, 2021

(86) PCT No.: PCT/EP2021/055811
§ 371 (c)(1),
(2) Date: Sep. 8, 2023

(87) PCT Pub. No.: WO2022/188948
PCT Pub. Date: Sep. 15, 2022

(65) Prior Publication Data
US 2024/0155802 A1 May 9, 2024

(51) Int. Cl.
*H05K 7/20* (2006.01)
(52) U.S. Cl.
CPC .............................. *H05K 7/20136* (2013.01)
(58) Field of Classification Search
None
See application file for complete search history.

(56) References Cited

U.S. PATENT DOCUMENTS

| | | | | |
|---|---|---|---|---|
| 5,544,012 A | * | 8/1996 | Koike | H05K 7/20572 |
| | | | | 165/122 |
| 8,279,601 B2 | * | 10/2012 | Lima | G06F 1/20 |
| | | | | 361/695 |
| 2019/0357380 A1 | * | 11/2019 | Preuss | H05K 7/20736 |
| 2020/0128701 A1 | | 4/2020 | Whitehead et al. | |

FOREIGN PATENT DOCUMENTS

WO    WO 2010/110790 A1    9/2010

OTHER PUBLICATIONS

International Search Report and Written Opinion dated Nov. 16, 2023 for Application No. PCT/EP2021/055811, 8 pages.
International Preliminary Report on Patentability dated Sep. 12, 2023 for Application No. PCT/EP2021/055811, 6 pages.

* cited by examiner

*Primary Examiner* — Mukundbhai G Patel
(74) *Attorney, Agent, or Firm* — FBT Gibbons LLP

(57) ABSTRACT
There is provided a telecommunications network equipment unit, comprising a cooling system. The cooling system comprises an air input channel and an exhaust air output, wherein the exhaust air output is separate from the air input channel. The cooling system further comprises a plurality of air conduits. The plurality of air conduits is arranged such that heat can be transferred from respective ones of a plurality of devices in the telecommunications network equipment to air passing through respective ones of the plurality of air conduits. Each of the plurality of air conduits is arranged to receive a respective outflow of air from the air input channel and to direct said outflow of air therethrough to the exhaust air output. There is further provided telecommunications network equipment comprising one or more telecommunications network equipment units.

20 Claims, 7 Drawing Sheets

TELECOMMUNICATIONS NETWORK EQUIPMENT UNIT COMPRISING A COOLING SYSTEM

CROSS REFERENCE TO RELATED DATA

This application is a national-phase entry under 35 USC § 371 of International Application No. PCT/EP2021/055811, filed Mar. 8, 2021, titled "Telecommunications Network Equipment Unit Comprising A Cooling System," the contents of which are hereby incorporated herein in its entirety.

TECHNICAL FIELD

The present invention relates to telecommunications network equipment units and, more particularly, to telecommunications network equipment units comprising cooling systems. The present invention further relates to telecommunications network equipment comprising one or more telecommunications network equipment units.

BACKGROUND

Thermal management of pluggable optical components, such as optical transceivers, is critical to ensure that the temperature of these devices remains within the specified range. If the temperature of these devices exceeds the specified range, operation of these devices may be impaired. The lifespan of these devices may also be shortened.

Telecommunications network equipment units typically comprise a plurality of pluggable optical transceivers. Such telecommunications network equipment units may be referred to as "pizza boxes" and may be configured for slotting into a network device rack. A plurality of pluggable optical transceivers is typically located along the front of each unit, where they are accessible to a network operator. An example of such a telecommunications network equipment unit 10 is shown in FIG. 1. In this example, the telecommunications network unit 10 comprises two rows of pluggable optical transceivers 20 plugged into the front of the unit 10.

A known cooling system for these pluggable optical transceivers 20 utilises "front to rear" airflow. In the example shown in FIG. 1, air is drawn by a fan 30 positioned at the rear of the telecommunications network unit 10 such that air enters the unit 10 from the front of the unit 10, passing and thereby cooling each of the pluggable optical transceivers 20, before being output from the rear of the unit 10. This cooling system may provide effective cooling of each optical transceiver 20. Thus, it is possible to provide a large number of high performance pluggable optical transceivers 20 on the front of the telecommunications network unit 10, thereby increasing the connectivity and traffic capacity of the unit 10, without the specified temperature ranges of the optical transceivers 20 being exceeded and thus their operation potentially impaired and lifespan shortened.

However, a "front to rear" airflow cooling system is not suitable for use in all telecommunications network equipment. For example, ETSI (European Telecommunications Standards Institute) network equipment standards require "side to side" airflow cooling in ETSI central office/rack equipment. This reflects the predetermined flow of cool and warm air in the room in which the network equipment is to be located.

An example "side to side" airflow cooling system in a telecommunications network equipment unit 10 is shown in FIG. 2. Similarly to the telecommunications network equipment unit 10 shown in FIG. 1, a fan 30 is arranged at a side of the telecommunications network equipment unit 10, but in the telecommunications network equipment unit 10 of FIG. 2 the fan 30 is arranged at the left hand side of the unit 10, rather than at the back of the unit 10. The fan 30 is arranged to draw air, such that air inputs the telecommunications network unit 10 from the opposite side of the unit 10 (in this example, the right hand side of the unit 10), passing over each of the pluggable optical transceivers 20 in turn, before exiting the unit 10 from the left hand side of the unit 10.

This "side to side" airflow cooling system cools each of the optical transceivers 20. However, the Applicant has appreciated that this cooling system is less effective than "front-to-rear" airflow cooling since heat will transfer between the pluggable optical transceivers 20 via the air passing over them. Since the air passes from one optical transceiver 20 to the next, each optical transceiver 20 will transfer heat to downstream optical transceivers 20. This means that the downstream optical transceivers 20 may not be cooled sufficiently to keep their temperature within the specified temperature range. This may risk that their operation is impaired, and lifespan shortened. Moreover, in order to ensure that the temperature of each of the optical transceivers 20 remains within the specified range, the number of and or power of the optical transceivers 20 provided along the front of the telecommunications network unit 10 may need to be limited. This disadvantageously limits the connectivity and traffic capacity of the telecommunications network unit 10. Use of a higher power fan may increase cooling by drawing more air through the unit 10 but would disadvantageously increase the power consumption of the unit 10.

SUMMARY

The present invention is defined in the independent claims to which reference is now directed.

According to an aspect of the present invention, there is provided a telecommunications network equipment unit. The telecommunications network equipment unit comprises a cooling system. The cooling system comprises an air input channel and an exhaust air output. The exhaust air output is separate from the air input channel. The cooling system further comprises a plurality of air conduits. The plurality of air conduits is arranged such that heat can be transferred from respective ones of a plurality of devices in the telecommunications network equipment to air passing through respective ones of the plurality of air conduits. Each of the plurality of air conduits is further arranged to receive a respective outflow of air from the air input channel and to direct said outflow of air therethrough to the exhaust air output.

Advantageously, embodiments of the present invention provide a telecommunications network equipment unit with a cooling system which can be used as a "side-to-side" airflow cooling system, thus meeting certain telecommunications network equipment standards, whilst providing more effective cooling of devices in the telecommunications network equipment unit than other solutions. Since different air can pass through each of the plurality of air conduits, heat from each of the plurality of devices can be transferred to "fresh" air and there may be no or limited heat transfer between the plurality of devices to be cooled. Thus, advantageously, many such devices, which may be high performance, high power devices, may be provided in the telecommunications network equipment unit, without exceeding their maximum temperature limits. Thus, the performance of the telecommunications network equipment unit may be increased. In particular, the connectivity and traffic capacity of the telecommunications network equipment unit may be increased, whilst ensuring the correct operation and longevity of the plurality of devices. Further, the power required to operate the cooling system may be limited.

In a preferred embodiment of the present invention, each of the plurality of air conduits may be arranged for thermal coupling to at least one of the plurality of devices. Thus, advantageously, heat can transfer from the plurality of devices to the air in the plurality of air conduits indirectly, without the air directly touching the devices. This arrangement has the advantage that the complexity of the cooling system may be reduced. Furthermore, advantageously, there may be no need for an air filter to be provided, unlike in the designs shown in FIGS. 1 and 2, to remove dust from the air before it enters the telecommunications network equipment unit. Thus, advantageously, maintenance of the unit can be reduced. For example, it should be appreciated that an air filter (not shown) would be provided on the right-hand side of the telecommunications network equipment unit 10 in FIG. 2 to remove dust from the air before it enters the unit 10. Dust may affect the operation of the plurality of devices. However, maintenance of such air filters is required. For example, the air filter provided in the telecommunications network equipment unit 10 of FIG. 2 may need to be manually cleaned at least once a year to ensure effective operation, and possibly more often if the unit 10 is located at the bottom of a device rack, near the floor, since dust on the floor is more likely to clog up the filter.

In a preferred embodiment of the present invention, the plurality of air conduits may be formed as an integral component. Advantageously, this design may simplify manufacture and assembly of the cooling system and thereby reduce manufacturing costs. For example, since in embodiments of the present invention, the plurality of air conduits may be made as one "heat sink" part, this part may be relatively easily die-casted as a single part, and there is no need to produce different "heat sink" parts for different ones of the plurality of devices.

In an embodiment of the present invention, the cooling system may further comprise one or more fans arranged to force air into the air input channel.

In an embodiment of the present invention, the air input channel may be arranged on a different layer of the telecommunications network equipment unit from the plurality of air conduits such that the outflows of air from the air input channel are input into respective ones of the plurality of air conduits at an angle substantially perpendicular to the direction of airflow along the length of the air conduit. Advantageously, this arrangement may provide an elegant, compact design, which is easier to manufacture and suitable for use in telecommunications network equipment units of standard dimensions, particularly but not exclusively where the plurality of devices is at or will be plugged into the front of the unit.

In an embodiment of the present invention, the exhaust air output may comprise an air output channel.

In an embodiment of the present invention, each of the plurality of air conduits may be arranged such that air arrives at the air output channel from the respective air conduit at an angle non-perpendicular to the length of the air output channel. Advantageously, this may facilitate flow of the air along the length of the air output channel, and thus the effectiveness of exhaust air removal and thereby airflow through the cooling system, which may increase the effectiveness of cooling.

In an embodiment of the present invention, each of the plurality of air conduits may have at least one bend along its length. This may enable a compact design which provides effective cooling.

In an embodiment of the present invention, the plurality of devices may be a plurality of optical devices.

In an embodiment of the present invention, the telecommunications network equipment unit may further be configured to accommodate the plurality of devices in a front portion of the telecommunications network equipment unit.

In an embodiment of the present invention, the plurality of devices may be a plurality of pluggable optical devices. In this case, the telecommunications network equipment unit may comprise a plurality of sockets each configured to accommodate a respective one of the plurality of pluggable optical devices.

In an embodiment of the present invention, the telecommunications network equipment unit may further comprise at least one downstream device. The plurality of air conduits may be arranged such that heat can be transferred from the at least one downstream device to air passing through at least one of the plurality of air conduits. The downstream device may be coupled to the at least one of the plurality of air conduits downstream from at least one of the plurality of devices. Thus, the downstream device may transfer heat to air which has already been used to cool one of the plurality of devices. This may limit the effectiveness of the cooling of the downstream device. However, the applicant has appreciated that some devices may require less cooling than others and, advantageously, this design enables the cooling system to cool more components, without compromising on the cooling of the plurality of devices.

In an embodiment of the present invention, the at least one downstream device may be an electronic device. It should be appreciated that electronic devices may be able to operate effectively at higher temperatures than optical devices.

In an embodiment of the present invention, the air input channel may be arranged such that air is input into the air input channel from a first side of the telecommunications network unit. The exhaust air output may be arranged such that exhaust air is output from an opposite side of the telecommunications network equipment unit.

In an embodiment of the present invention, the plurality of air conduits may be arranged such that the direction of airflow through each of the plurality of air conduits has at least a component perpendicular to the direction of airflow along the air input channel.

In an embodiment of the present invention, the cooling system further comprises a further air input channel and a further exhaust air output separate from the further air input channel. The cooling system may further comprise a further plurality of air conduits. The further plurality of air conduits may be arranged such that heat can be transferred from respective ones of a further plurality of devices in the telecommunications network equipment to air passing through respective ones of the further plurality of air conduits. Each of the further plurality of air conduits may be arranged to receive a respective outflow of air from the further air input channel and to direct said outflow of air therethrough to the further exhaust air output.

In an embodiment of the present invention, where the air input channel is arranged above the plurality of devices, the further air input channel may be arranged below the further plurality of devices. In this case, the further air input channel may be arranged on a different layer of the telecommunications network unit from the further plurality of air conduits such that the outflows of air from the further air input channel are input into respective ones of the further plurality of air conduits at an angle substantially perpendicular to the direction of airflow along the length of the air conduit. Advantageously, this arrangement may provide an elegant, compact design, which is easier to manufacture and suitable for use in telecommunications network equipment units of standard dimensions, particularly but not exclusively where the plurality of devices is at or will be plugged into the front of the unit.

In an embodiment of the present invention, the one or more fans may be arranged to force air into both the air input channel and the further air input channel. Thus, the one or more fans may advantageously be used to cool a larger number of devices.

There is also provided telecommunications network equipment comprising at least one telecommunication network equipment unit according to an embodiment of the present invention.

The telecommunications network equipment may comprise a rack having a plurality of openings. At least one of the plurality of openings may have arranged within one or more telecommunication network equipment units according to an embodiment of the present invention.

DESCRIPTION OF THE FIGURES

Embodiments of the present invention will now be described, by way of example only, with reference to the Figures:

FIG. 5 shows a cross section of a side of the telecommunications network equipment unit of FIG. 4 according to a first embodiment of the present invention;

FIG. 6 shows a cross section of a side of the telecommunications network equipment unit of FIG. 4 according to a second embodiment of the present invention;

DETAILED DESCRIPTION

Figure 1:
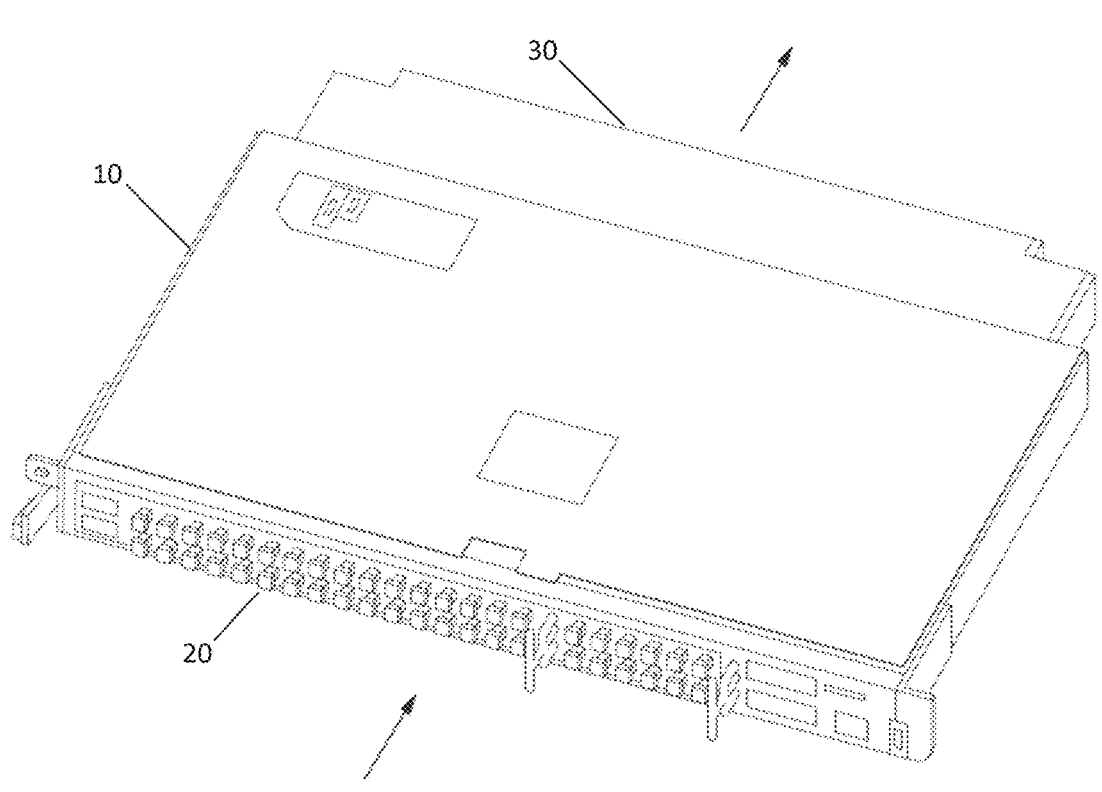
FIG. 1, referred to above, shows a known telecommunications network equipment comprising a "front to rear" airflow cooling system.
Figure 2:
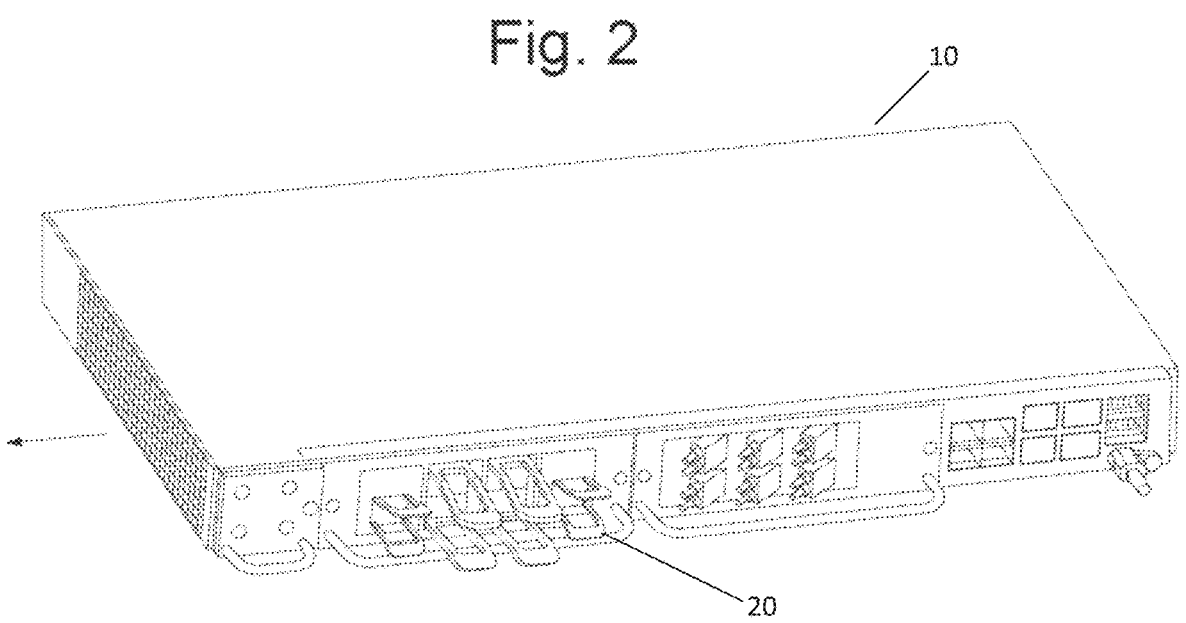
FIG. 2, referred to above, shows a known telecommunications network equipment unit comprising a "side to side" airflow cooling system.
Figure 3:
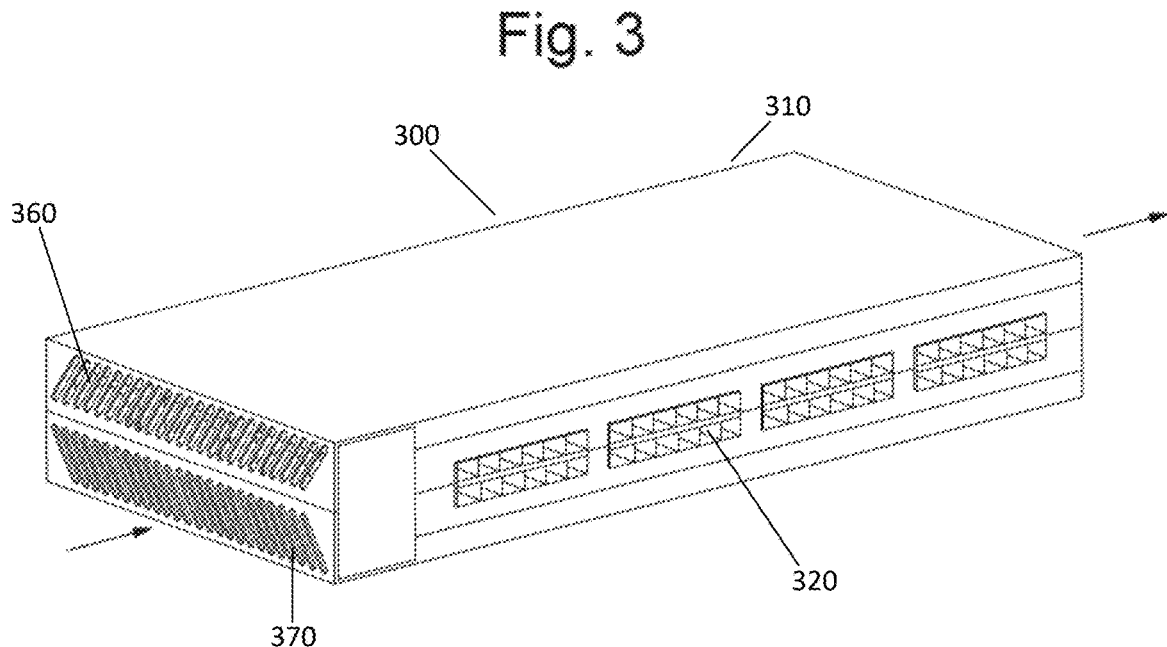
FIG. 3 shows a telecommunications network equipment unit according to an embodiment of the present invention.

FIG. 3 shows a telecommunications network equipment unit 300 according to an embodiment of the present invention. In this example, the telecommunications network equipment unit 300 has a "side to side" airflow cooling system and is suitable for use in ETSI network equipment. In particular, the telecommunications network equipment unit 300 is suitable for slotting into an ETSI compliant network device rack. As mentioned above, ETSI network equipment standards currently specify "side to side" air flow cooling for compatible telecommunications network equipment units. However, it should be appreciated that telecommunications network equipment units 300 embodying the present invention may be used in other types of telecommunication network equipment, particularly but not exclusively where "side to side" cooling is required or desired.

In this example, the telecommunications network equipment unit 300 has a casing 310 and the unit 300 has a substantially cuboid shape. In this example, as indicated by the arrows in FIG. 3, the cooling system is arranged such that air inputs the telecommunications network equipment unit 300 from a first side of the unit (in this example the left hand side) and exits the telecommunications network equipment unit 300 from the opposite side of the unit (in this example right-hand side of the unit).

The cooling system is arranged such that it can cool a plurality of devices (not shown) in the telecommunications network equipment unit 300, which, in operation, generate heat. In this example, the plurality of devices are optical devices. More particularly, in this example, the optical devices are optical transceivers. However, it should be appreciated that the optical devices may be other types of optical devices. As mentioned above, optical devices are typically very sensitive to overheating and thus require effective cooling. However, it possible that the plurality of devices could be a different type of device such as a plurality of electronic devices.

Further, in this example, the plurality of devices are pluggable devices, and more particularly pluggable optical devices. This means that the plurality of devices can be plugged into the telecommunications network equipment unit 300, for example after installation, and may also be removable from the telecommunications network equipment unit 300. In this example, as shown for example in FIG. 3, the telecommunications network equipment unit 300 is configured to accommodate the plurality of pluggable devices. More particularly, the telecommunications network equipment unit 300 comprises a plurality of sockets 320 each configured to accommodate a respective one of the plurality of pluggable optical devices (not shown). These sockets 320 may for example comprise a metal cage. These sockets 320 are shown in more detail in FIG. 10, which shows the sockets 320 attached to a board 1000. It should be appreciated, however, that it is possible that in other embodiments the plurality of devices could alternatively be fixed within the telecommunications network equipment unit 300.

In this example, the telecommunications network equipment unit 300 is configured to accommodate the plurality of devices in a front portion of the unit 300. Thus, in this example, the plurality of sockets 320 are located along the front of the unit 300. In this example, there are two rows of sockets 320. However, for the purposes of the below description, the "plurality of devices" refers to the pluggable optical devices which can be plugged into the upper row of the sockets 320.

The cooling system comprises an air input channel 330, an exhaust air output 340 separate from the air input channel 330, and a plurality of air conduits 350 (none shown in FIG. 3)

Figure 4:
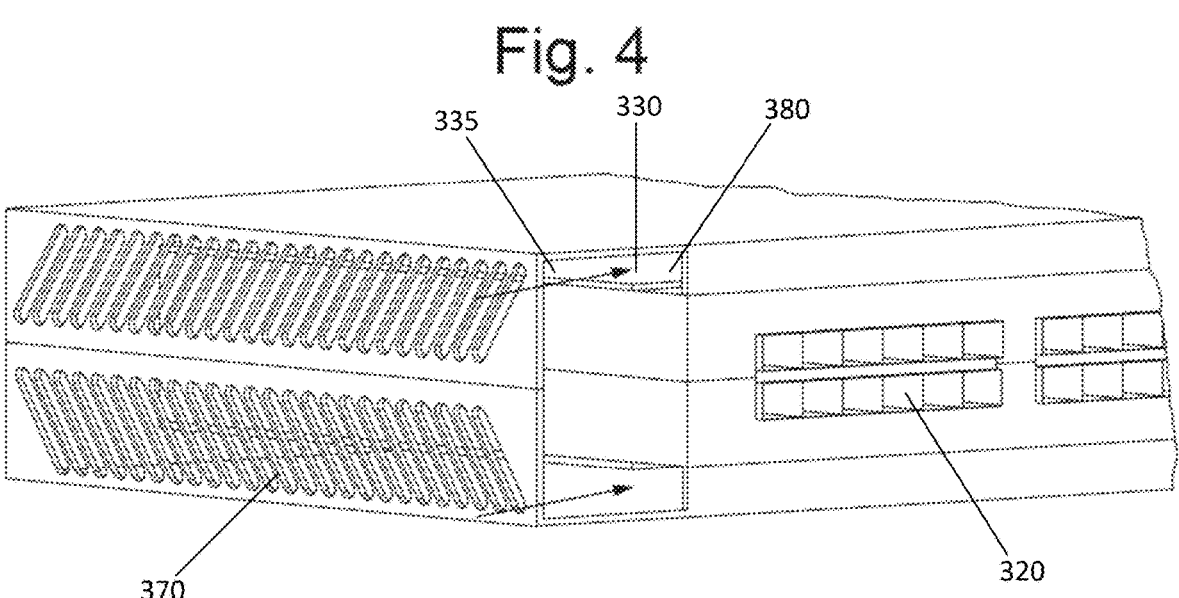
FIG. 4 shows an internal view of the telecommunications network equipment unit of FIG. 4.

FIG. 4 shows an internal view of the telecommunications network equipment unit 300 from the first side of the unit 300, which shows a portion of the air input channel 330. In this example, the air input channel 330 is arranged such that air is input into the air input channel 330 from the first side of the telecommunications network equipment unit 300.

In this embodiment, one or more fans 360 (not shown in FIG. 4, but shown in FIG. 3) are arranged to force air into the air input channel 330. In this example, the air input channel 330 has an end or air input 335 located adjacent the one or more fans 360 at the first side of the telecommunications network equipment unit 300.

As shown in FIG. 3, in this embodiment, a plurality of fans 360 are arranged at the first side of the telecommunications network equipment unit 300. This is the same side of the unit 300 as air inputs the unit 300. These fans 360 are arranged to force air into the unit 300 (from outside of the telecommunications network equipment unit 300), and more particularly into the air input channel 330 (not shown in FIG. 3). It should be appreciated that, whilst three fans 360 are shown in this embodiment, more or fewer including only one fan may be provided in other embodiments of the telecommunications network equipment unit 300. These one or more fans 360 may be part of a fixed or detachable module. In this example, the one or more fans 360 are provided inside the telecommunications network equipment unit 300 and a grating 370 is provided on the outer surface of the unit 300 encasing the one or more fans 360 and configured such that air can enter the unit 300 therethrough. However, other arrangements are possible. It should be noted that, in this embodiment, advantageously, no air filter is or needs to be provided to filter the input air before it enters the air input channel. In this example, as shown in FIG. 4, the plurality of devices is sealed from the one or more fans 360 such that the air cannot touch the plurality of devices. In this example, the seal is provided by parts of the components comprising the plurality of air conduits 350. However, other configurations are possible.

Figures 5, 6:
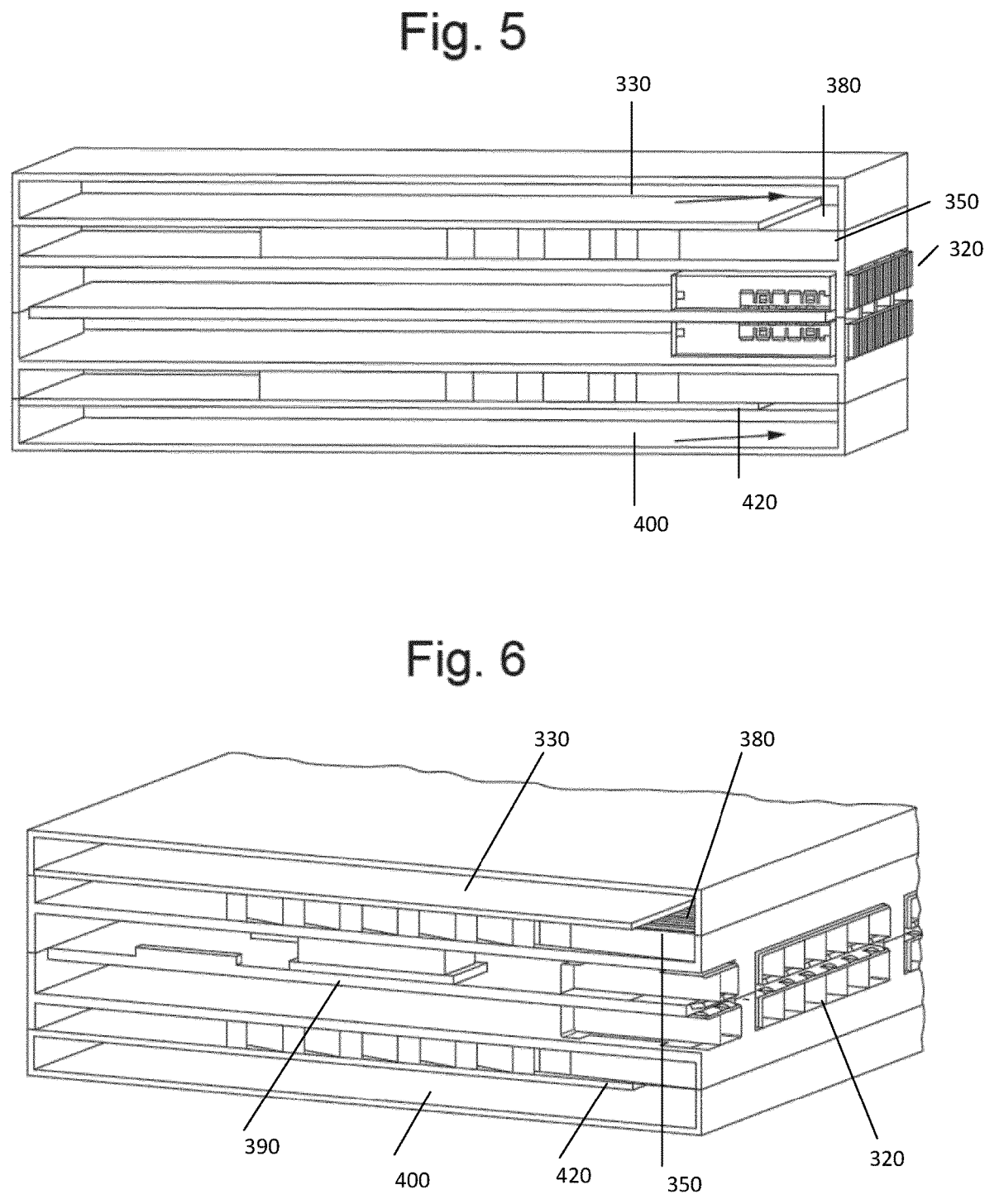

FIG. 5, which is a cross section view of the telecommunications network equipment unit 300 from the first side of the unit 300, shows the dimensions of the air input channel 330. In this example, the air input channel 330 is arranged at an upper layer of the telecommunications network equipment unit 300. This layer is above the sockets 320 in which the plurality of devices can be plugged. Further, in this example, the air input channel 330 extends across the entire length and width of the telecommunications network unit 300. In operation, air will enter the air input channel 330 at the air input 335 and travel along the length of the air input channel 330, as indicated by the arrows in FIG. 4. In this example, air will also flow to a plurality of air conduits 350 located on a lower layer of the unit 300, via an aperture 380, as will be described in more detail below.

Figure 7:
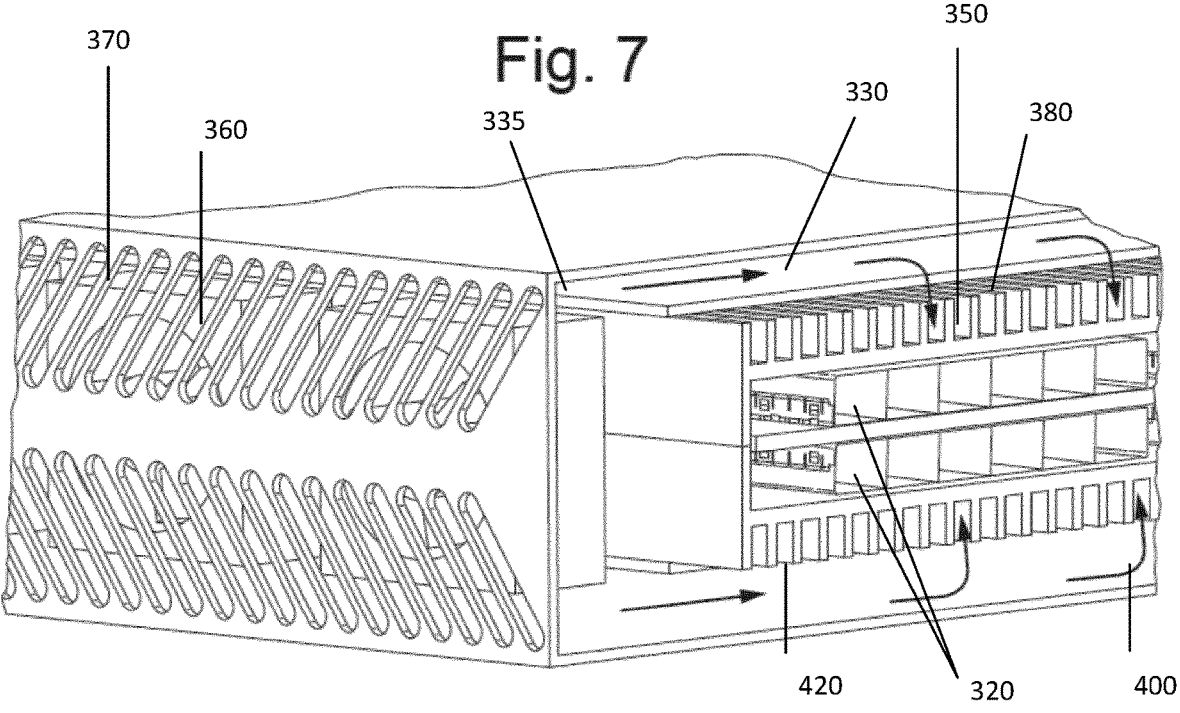
FIG. 7 shows a cross section of the front of the telecommunications network equipment of FIG. 4.
Figure 8:
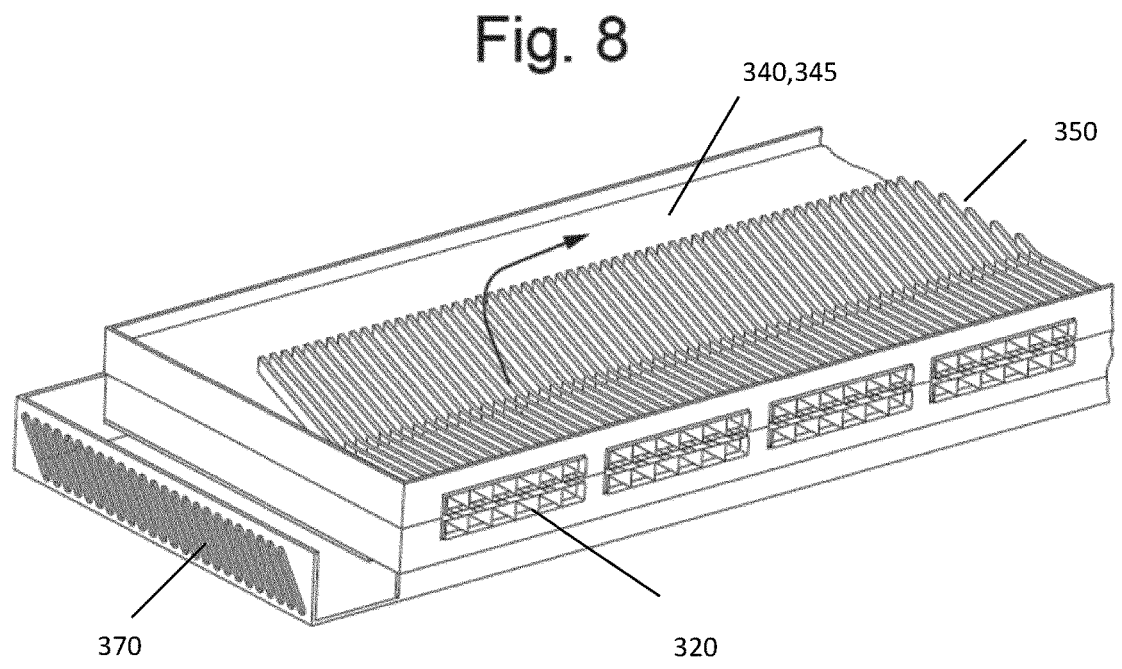
FIG. 8 shows a further internal part of the telecommunications network equipment unit of FIG. 4.

FIGS. 5, 7 and 8 illustrate the plurality of air conduits 350 in this embodiment of the present invention. FIG. 7 shows an internal cross section of the front of the telecommunications network equipment unit 300. FIG. 8 shows an internal top view of the telecommunications network equipment unit 300. In this example, the plurality of air conduits 350 is in a intermediate layer of the telecommunications network equipment unit 300, below the air input channel 330 and above the plurality of devices/sockets 320.

The plurality of air conduits 350 is arranged such that heat can be transferred from respective ones of the plurality of devices in the telecommunications network equipment unit 300 (when they are plugged into the unit 300) to air passing through respective ones of the plurality of air conduits 350.

In this example, each of the plurality of air conduits 350 is arranged for thermal coupling to at least one of the plurality of devices. This means that, advantageously, the air which passes through the air conduits 350 need not touch the plurality of devices to receive heat from the plurality of devices. The plurality of air conduits 350 is arranged such that heat can be transferred from the plurality of devices to the plurality of air conduits 350 by conduction. The heat can then be transferred from the plurality of air conduits to air passing through the respective air conduits 350. The plurality of air conduits 350 may therefore be considered a heat sink. It should be appreciated that the plurality of air conduits 350 may be configured, as shown in FIGS. 7 and 8, such that heat energy can be transferred from a respective one of the plurality of devices to more than one of the plurality of air conduits. It is also possible in some embodiments that heat energy may be transferred from more than one of the plurality of devices to a respective one of the plurality of air conduits 350. However, in any case, the plurality of air conduits 350 is arranged such that respective heat energy can be transferred from respective ones of the plurality of devices in the telecommunications network equipment unit 300 to respective ones of the plurality of air conduits 350, and thereby to air passing through respective ones of the plurality of air conduits 350.

This thermal coupling between the devices and the air conduits may be direct or indirect, and the plurality of air conduits 350 may be arranged for thermal coupling to the plurality of devices in several ways. For example, thermal pads may be arranged between the air conduits 350 and the respective devices or device sockets 320. Alternatively, thermal grease may be used to thermally couple the air conduits 350 and the devices, particularly where there is a small gap therebetween. Alternatively, a metallic spring may provide thermal coupling or contact therebetween. In this example, where the plurality of devices is a plurality of pluggable optical devices, the pluggable optical devices and respective sockets 320 may be configured such that an aluminium part is pushed up when the optical device is inserted into the socket 320 such that the optical device makes thermal contact with the respective one or more air conduits 350 via the aluminium part.

In this example, the plurality of air conduits 350 is made at least partially from gold. However, the plurality of air conduits 350 may comprise other heat conductive materials such as aluminium or copper (or alloy). It should be noted that, in this example, this conductive portion of the plurality of air conduits 350 is arranged for thermal coupling to the plurality of devices.

In this embodiment, the plurality of air conduits 350 is formed as an integral component. That is, at least a portion of each of the plurality of air conduits 350 is formed as a single part. This can be seen from FIGS. 5, 7 and 8 from different angles. In this example, adjacent ones of the plurality of air conduits 350 share a wall. This integral arrangement has the advantage that the plurality of air conduits 350 may be die cast as a single part, which may lower production costs. However, it is possible that the respective air conduits 350 could be manufactured separately. Further, it should be noted that, in this example, an upper wall of the plurality of air conduits 350 (which is not in thermal contact with the plurality of devices) is provided by a separate part. More particularly, in this example, a panel 355, which also forms a wall of the air input channel 330, provides the upper wall of the plurality of air conduits. This panel 355 may be formed from a different material from the heat conductive/heat sink part of the plurality of air conduits 350.

Each of the plurality of air conduits 350 is arranged to receive a respective outflow of air from the air input channel 330 and to direct said outflow of air therethrough to an exhaust air output 340. In this example, the airflows pass to the respective air conduits 350 from the air input channel 330 via aperture 380.

In this example, as mentioned above, the plurality of air conduits 350 is located on a layer of the telecommunications network equipment unit 300 below the air input channel 330. This means that the air input channel 330 is arranged on a different layer of the telecommunications network equipment unit 300 from the plurality of air conduits 350 such that the outflows of air from the air input channel 330 are input into respective ones of the plurality of air conduits 350 at an angle substantially perpendicular to the direction of airflow along the length of the respective air conduit 350. It should be appreciated that this arrangement enables an input portion of the plurality of air conduits 350 to be located at the front of the telecommunications network equipment unit 300, and therefore the plurality of air conduits 350 can be arranged to cool the plurality of devices (not shown) which can be plugged into the front of the unit 300. This arrangement may also provide a compact design.

In this embodiment, the plurality of air conduits 350 is arranged such that the direction of airflow through each of the plurality of air conduits 350 has at least a component perpendicular to the direction of airflow along the air input channel 330. This means that, whilst air can be input into the air input channel 330 from a side of the telecommunications network equipment unit 300 as part of "side to side" airflow cooling, the direction of air travel through the plurality of air conduits 350 as it cools the plurality of devices is "front to back". Advantageously, different air may therefore be used to cool respective ones of the plurality of devices, reducing heat transfer between the devices and increasing the effectiveness of the cooling.

In this example each of the plurality of air conduits 350 is arranged to guide air passing therethrough towards the exhaust air output 340. As shown in FIG. 8, each of the plurality of air conduits 350 may have at least one bend along its length.

Figures 9, 10, 11:
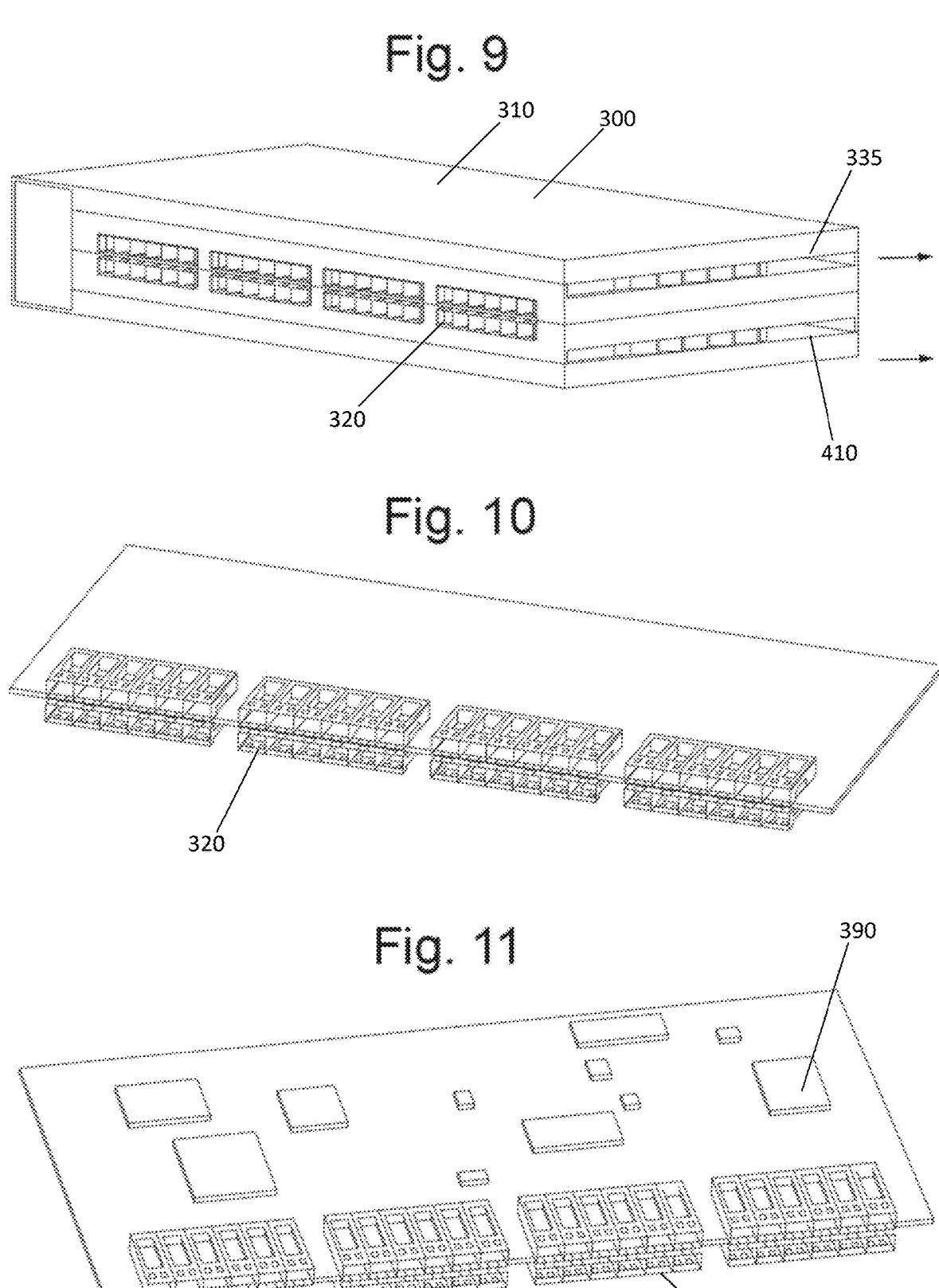
FIG. 9 shows the telecommunications network equipment unit of FIG. 4 from the opposite side.
FIG. 10 shows a further internal part of the telecommunications network equipment unit of FIG. 4 according to the first embodiment of the present invention.
FIG. 11 shows a further internal part of the telecommunications network equipment unit of FIG. 4 according to the second embodiment of the present invention.

FIGS. 8 and 9 show the exhaust air output 340. FIG. 9 shows the telecommunications network equipment unit 300 from a second side of the unit 300 opposite from the first side. As mentioned above, in this example, the exhaust air output 340 is arranged such that exhaust air is output from the second side of the telecommunications network equipment unit 300. As shown in FIG. 9, in this example the exhaust air output 340 comprises an opening in the second side of the telecommunications network equipment unit 300.

In this example, the exhaust air output 340 comprise an air output channel 345. In this example, each of the plurality of air conduits 350 is arranged to pass or transfer air to the air output channel 345 at a respective location along the length of the air output channel 345. Further, in this example, each of the plurality of air conduits 350 is arranged such that air arrives at the air output channel 345 from the respective air conduit at an angle non-perpendicular to the length of the air output channel 345. Advantageously, this arrangement may facilitate air flow along the air output channel 345. However, again, it should be appreciated that other arrangements are possible.

In a preferred embodiment of the present invention, the telecommunications network equipment unit 300 may further comprise at least one downstream device 390 which can be cooled by the cooling system. Such a downstream device 390 is shown in FIG. 6 which shows an alternative cross section of the first side of the telecommunications network equipment unit 300. In this example, the at least one downstream device 390 is an electronic device. For example, the at least one downstream device may be a network processor, ASIC (Application Specific Integrated Circuit), FPGA (Field Programmable Gate Array), microprocessor or power supply. A plurality of such downstream devices 390 is also shown in FIG. 11, which illustrates a board having attached thereto the plurality of sockets 320 and a plurality of electronic downstream devices 390.

In this preferred embodiment, the plurality of air conduits 350 is arranged such that heat can be transferred from the at least one downstream device 390 to air passing through at least one of the plurality of air conduits 350. More particularly, in this example, the downstream device 390 is thermally coupled to at least one of the plurality of air conduits 350. In this way, the plurality of air conduits 350 can also provide a heat sink for one or more other devices in the telecommunications network equipment unit 300. The downstream device 390 is arranged for coupling to the at least one of the plurality of air conduits 350 downstream from at least one of the plurality of devices (considering the direction of air flow along the at least one of the plurality of air conduits 350). It will be appreciated that there will be some heat transfer between the at least one of the plurality of devices and the downstream device 390. However, the applicant has appreciated that some types of devices may be able to operate correctly at higher temperatures than others, for example electronic devices may be able to operate at higher temperatures than optical devices. Thus, this arrangement may still provide effective cooling for the downstream device 390, which prioritising cooling for the plurality of devices.

As shown in FIGS. 3 to 7 and FIG. 9 in the described embodiment, the cooling system further comprises a further air input channel 400 and a further exhaust air output 410 separate from the further air input channel 400. The cooling system also further comprises a further plurality of air conduits 420. The further plurality of air conduits 420 is arranged such that heat can be transferred from respective ones of a further plurality of devices (not shown) in the telecommunications network equipment 300 to air passing through respective ones of the further plurality of air conduits 420. In this example, this further plurality of devices is those that can be plugged into the bottom row of sockets 320 in the telecommunications network equipment unit 300. Each of the further plurality of air conduits 420 may be arranged to receive a respective outflow of air from the further air input channel 400 and to direct said outflow of air therethrough to the further exhaust air output 410. This arrangement enables the cooling system to cool a larger number of devices. However, it will be appreciated that such a further air input channel 400, further exhaust air output 410 and further plurality of air conduits 420 may be omitted for other embodiments of the present invention.

Generally, each of the further air input channel 400, further exhaust air output 410 and the further plurality of air conduits 420 may be configured similarly to the air input channel 330, exhaust air output 340 and the plurality of air conduits 350 as described above.

A difference however is that, in this example, where the air input channel 330 is arranged above the sockets 320 for the plurality of devices, the further air input channel 400 is arranged below the sockets 320 for the further plurality of devices. Thus, the further air input channel 400 is arranged at a different layer of the telecommunications network equipment unit 300 than the plurality of air conduits 430 such that the outflows of air from the further air input channel 400 are input into respective ones of the further plurality of air conduits 430 at an angle substantially perpendicular to the direction of airflow along the length of the air conduit 430.

In this example, as shown in FIGS. 3 and 4, the one or more fans 360 are arranged to force air into both the air input channel 330 and the further air input channel 400. This may provide an efficient arrangement.

Figure 12:
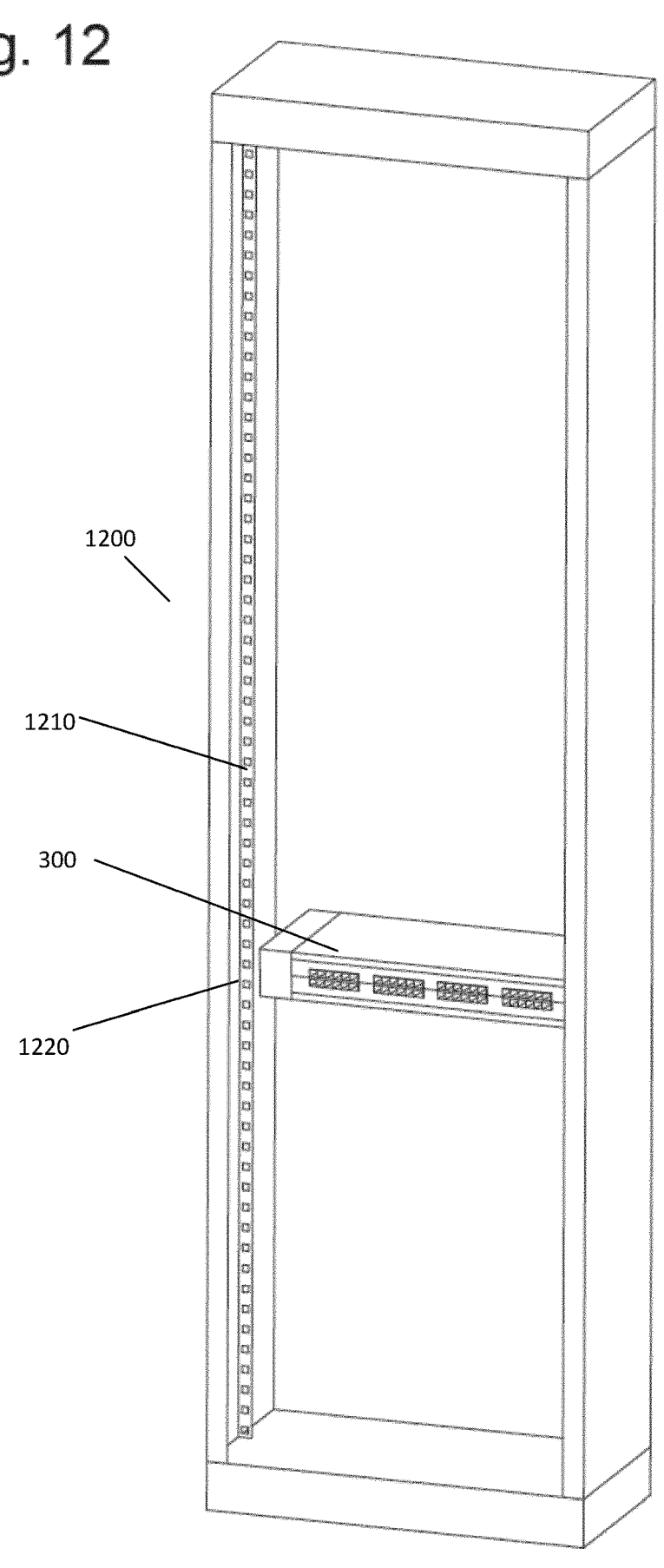
FIG. 12 shows telecommunications network equipment comprising a telecommunications network equipment unit embodying the present invention.

FIG. 12 shows telecommunications network equipment 1200 comprising at least one telecommunication network equipment unit 300 according to an embodiment of the present invention. In this example, the telecommunications network equipment 1200 is ETSI compliant network equipment. However, the telecommunications network equipment could be a different type of network equipment.

Figure 13:
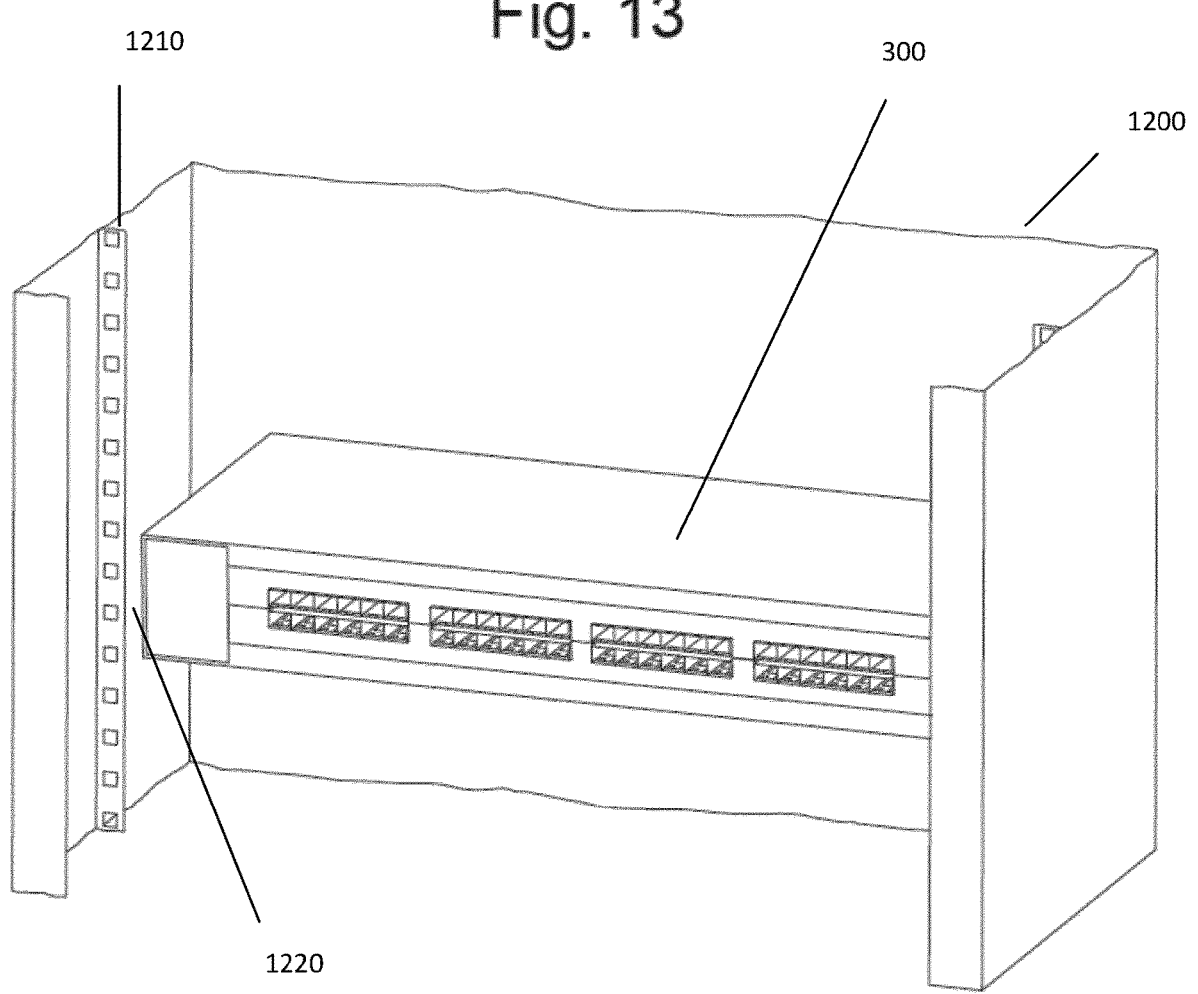
FIG. 13 shows the telecommunications network equipment unit arranged in the telecommunications network equipment of FIG. 12 in more detail.

In this example, the telecommunications network equipment 1200 comprises a rack 1210 having a plurality of openings 1220. At least one of the plurality of openings 1220 has arranged within a telecommunication network equipment unit 300 according to an embodiment of the present invention. This arrangement is shown in more detail in the section of the telecommunications network equipment 1200 shown in FIG. 13. As can be seen, in this example, the plurality of devices can be plugged into the front of the unit 300, which is accessible even when the telecommunications network equipment unit 300 is arranged in the respective opening 1220.

Thus, embodiments of the present invention advantageously provide a telecommunications network equipment unit with a cooling system which can be used as a "side-to-side" airflow cooling system, thus meeting certain telecommunications network equipment standards such as ETSI network equipment standards, whilst providing more effective cooling of devices in the telecommunications network equipment unit than other solutions. Since different air can pass through each of the plurality of air conduits, heat from each of the plurality of devices can be transferred to "fresh" air and there may be no or limited heat transfer between the plurality of devices to be cooled. Thus, advantageously, many such devices, which may be high performance, high power devices, may be provided in the telecommunications network equipment unit, without exceeding their maximum temperature limits. Thus, the performance of the telecommunications network equipment unit may be increased. In particular, the connectivity and traffic capacity of the telecommunications network equipment unit may be increased, whilst ensuring the correct operation and longevity of the plurality of devices. Further, the power required to operate the cooling system may be limited.

The invention claimed is:

1. A telecommunications network equipment unit, comprising:
   a cooling system;
   wherein the cooling system comprises:
      an air input channel;
      an exhaust air output, wherein the exhaust air output is separate from the air input channel; and a plurality of air conduits, wherein the plurality of air conduits is arranged such that heat can be transferred from respective ones of a plurality of devices in the telecommunications network equipment to air passing through respective ones of the plurality of air conduits, wherein each of the plurality of air conduits is arranged to receive a respective outflow of air from the air input channel and to direct said outflow of air therethrough to the exhaust air output, wherein each of the plurality of air conduits is physically separated from adjacent air conduits by solid walls extending along a length of the air conduits from the air input channel to the exhaust air output, and wherein the plurality of air conduits comprises a heat conductive material arranged to thermally couple with the plurality of devices for transferring heat from the devices to air flowing through the air conduits.

2. A telecommunications network equipment unit according to claim 1, wherein each of the plurality of air conduits is arranged for thermal coupling to at least one of the plurality of devices in the telecommunications network equipment.

3. A telecommunications network equipment unit according to claim 1, wherein the plurality of air conduits is formed as an integral component.

4. A telecommunications network equipment unit according to claim 1, wherein the cooling system further comprises one or more fans arranged to force air into the air input channel.

5. A telecommunications network equipment unit according to claim 1, wherein the air input channel is arranged on a different layer of the telecommunications network equipment unit from the plurality of air conduits such that the outflows of air from the air input channel are input into respective ones of the plurality of air conduits at an angle substantially perpendicular to the direction of airflow along the length of the air conduit.

6. A telecommunications network equipment unit according to claim 1, wherein the exhaust air output comprises an air output channel.

7. A telecommunications network equipment unit according to claim 6, wherein each of the plurality of air conduits is arranged such that air arrives at the air output channel from the respective air conduit at an angle non-perpendicular to the length of the air output channel.

8. A telecommunications network equipment unit according to claim 1, wherein each of the plurality of air conduits has at least one bend along its length.

9. A telecommunications network equipment unit according to claim 1, wherein the plurality of devices is a plurality of optical devices.

10. A telecommunications network equipment unit according to claim 1, wherein the telecommunications network equipment unit is configured to accommodate the plurality of devices in a front portion of the telecommunications network equipment unit.

11. A telecommunications network equipment unit according to claim 10, wherein the plurality of devices is a plurality of pluggable optical devices, and the telecommunications network equipment unit is configured to accommodate each of the plurality of pluggable optical devices.

12. A telecommunications network equipment unit according to claim 1, further comprising at least one downstream device, wherein the plurality of air conduits are arranged such that heat can be transferred from the at least one downstream device to air passing through at least one of the plurality of air conduits, wherein the downstream device is coupled to the at least one of the plurality of air conduits downstream from at least one of the plurality of devices.

13. A telecommunications network equipment unit according to claim 12, wherein the at least one downstream device is an electronic device.

14. A telecommunications network equipment unit according to claim 1, wherein the air input channel is arranged such that air is input into the air input channel from a first side of the telecommunications network unit, and wherein the exhaust air output is arranged such that exhaust air is output from an opposite side of the telecommunications network equipment unit.

15. A telecommunications network equipment unit according to claim 1, wherein the plurality of air conduits is arranged such that the direction of airflow through each of the plurality of air conduits has at least a component perpendicular to the direction of airflow along the air input channel.

16. Telecommunications network equipment comprising:
    at least one telecommunication network equipment unit according to claim 1.

17. Telecommunications network equipment according to claim 16, comprising:
    a rack having a plurality of openings, wherein at least one of the plurality of openings has arranged within one or more telecommunication network equipment units.

18. A telecommunications equipment unit, comprising:
    a cooling system;
    wherein the cooling system comprises:
        an air input channel;
        an exhaust air output, wherein the exhaust air output is separate from the air input channel;
        a plurality of air conduits, wherein the plurality of air conduits is arranged such that heat can be transferred from respective ones of a plurality of devices in the telecommunications network equipment to air passing through respective ones of the plurality of air conduits, wherein each of the plurality of air conduits is arranged to receive a respective outflow of air from the air input channel and to direct said outflow of air therethrough to the exhaust air output;

a further air input channel;
        a further exhaust air output, wherein the further exhaust air output is separate from the further air input channel; and
        a further plurality of air conduits, wherein the further plurality of air conduits is arranged such that heat can be transferred from respective ones of a further plurality of devices in the telecommunications network equipment to air passing through respective ones of the further plurality of air conduits, wherein each of the further plurality of air conduits is arranged to receive a respective outflow of air from the further air input channel and direct said outflow of air therethrough to the further exhaust air output.

19. A telecommunications equipment unit according to claim 18,
    wherein the air input channel is arranged on a different layer of the telecommunications network equipment unit from the plurality of air conduits such that the outflows of air from the air input channel are input into respective ones of the plurality of air conduits at an angle substantially perpendicular to the direction of airflow along the length of the air conduit; and
    wherein the air input channel is arranged above the plurality of devices, and the further air input channel is arranged below the further plurality of devices, wherein the further air input channel is arranged on a different layer of the telecommunications network unit from the further plurality of air conduits such that the outflows of air from the further air input channel are input into respective ones of the further plurality of air conduits at an angle substantially perpendicular to the direction of airflow along the length of the air conduit.

20. A telecommunications equipment unit according to claim 18, wherein the cooling system further comprises one or more fans arranged to force air into the air input channel, and wherein the one or more fans are arranged to force air into both the air input channel and the further air input channel.

* * * * *